US008030652B2

(12) United States Patent
Shih et al.

(10) Patent No.: US 8,030,652 B2
(45) Date of Patent: Oct. 4, 2011

(54) PIXEL STRUCTURE AND FABRICATING METHOD THEREOF

(75) Inventors: Ming-Hung Shih, Hsinchu (TW); Shih-Chin Chen, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 399 days.

(21) Appl. No.: 12/055,326

(22) Filed: Mar. 26, 2008

(65) Prior Publication Data

US 2009/0057666 A1  Mar. 5, 2009

(30) Foreign Application Priority Data

Aug. 29, 2007   (TW) ................................ 96132010 A

(51) Int. Cl.
*H01L 29/04* (2006.01)
*H01L 29/10* (2006.01)
*H01L 31/00* (2006.01)

(52) U.S. Cl. .............. 257/59; 349/43; 349/187; 438/30; 438/149; 438/29; 438/22; 438/151

(58) Field of Classification Search .................. None
See application file for complete search history.

(56) References Cited

U.S. PATENT DOCUMENTS

| 2002/0106825 A1* | 8/2002 | Lee et al. | 438/30 |
| 2006/0138415 A1* | 6/2006 | Hung et al. | 257/59 |
| 2006/0199321 A1* | 9/2006 | Lo et al. | 438/197 |
| 2007/0002196 A1* | 1/2007 | Chiu et al. | 349/43 |
| 2007/0132903 A1* | 6/2007 | Lim | 349/43 |

FOREIGN PATENT DOCUMENTS

| CN | 1154490 | | 7/1997 |
| CN | 1831601 | | 9/2006 |
| CN | 1831601 A | * | 9/2006 |
| CN | 1834790 | | 9/2006 |

* cited by examiner

*Primary Examiner* — Ha Tran T Nguyen
*Assistant Examiner* — Shantanu C Pathak
(74) *Attorney, Agent, or Firm* — Jianq Chyun IP Office

(57) ABSTRACT

A pixel structure and a fabrication method thereof are provided. A substrate with a light-shielding layer and a flat layer formed thereon is provided. A first photomask process is conducted to pattern a first metal layer and a semiconductor layer for forming a source, a drain, a channel layer, a data line and a first pad. A second photomask process is conducted to pattern the protection layer, the second metal layer and the gate dielectric layer for forming a gate, a scan line and a second pad, and a part of the drain is exposed. A third photomask process is conducted to pattern a transparent conductive layer for forming a pixel electrode.

9 Claims, 8 Drawing Sheets

PIXEL STRUCTURE AND FABRICATING METHOD THEREOF

CROSS-REFERENCE TO RELATED APPLICATION

This application claims the priority benefit of Taiwan application serial no. 96132010, filed on Aug. 29, 2007. The entirety the above-mentioned patent application is hereby incorporated by reference herein and made a part of specification.

BACKGROUND OF THE INVENTION

1. Field of the Invention

The present invention generally relates to a pixel structure and a fabricating method thereof, and more particularly to a pixel structure and a fabricating method thereof capable of reducing the total number of photomasks.

2. Description of Related Art

A thin film transistor liquid crystal display (TFT-LCD) is mainly composed of a TFT array substrate, a color filter substrate and a liquid crystal layer. The TFT array substrate includes a plurality of TFTs arranged in an array and a plurality of pixel electrodes corresponding to each TFT. The above-mentioned TFT includes a gate, a channel layer, a drain and a source. A TFT and a pixel electrode compose a pixel structure. The TFT serves as a switch device of a liquid crystal display unit (LCD unit).

When fabricating a TFT, one of the most important considerations is to reduce the process steps thereof and thereby reduce the fabricating cost. In particular, the required number of the photomasks needs to be effectively reduced due to the expensive cost of each photomask.

Generally speaking, 4-7 photomasks are usually required to fabricate TFTs. In order to promote the process efficiency, the most of manufactures employ four photomask processes currently. However, along with the large-scale panel tendency all the related manufactures are pursuing nowadays, a higher cost problem brought by a larger photomask is a significant challenge for the manufactures to be confronted and to be solved.

SUMMARY OF THE INVENTION

Accordingly, the present invention is directed to a method for fabricating a pixel structure wherein only three photomasks are required.

The present invention is also directed to a pixel structure which can be fabricated by using only three photomasks.

Accordingly, the present invention provides a method for fabricating a pixel structure. First, a substrate, comprising a light-shielding layer and a flat layer covering the light-shielding layer formed thereon, is provided. Next, a semiconductor layer and a first metal layer are sequentially formed on the flat layer. Then, the first metal layer and the semiconductor layer are patterned so as to form a source, a drain, a channel layer, a data line and a first pad, wherein the channel layer is connected to the source and the drain, and the data line is connected to the source and the first pad. After that, a gate dielectric layer, a second metal layer and a protection layer are sequentially formed on the substrate. Furthermore, the protection layer, the second metal layer and the gate dielectric layer are patterned so as to form a gate, a scan line and a second pad and expose a part of the drain, wherein the gate and the channel layer are stacked on each other and the scan line is connected to the gate and the second pad. Furthermore, a transparent conductive layer is formed on the substrate. Moreover, the transparent conductive layer is patterned so as to form a pixel electrode, wherein the pixel electrode is electrically connected to the exposed part of the drain.

In an embodiment of the present invention, the step of pattering the first metal layer and the semiconductor layer further includes forming a lower electrode located at a position preserved for forming the scan line; the step of patterning the protection layer, the second metal layer and the gate dielectric layer further includes retaining the gate dielectric layer, the second metal layer and the protection layer all located over the lower electrode, wherein the gate dielectric layer serves as a capacitance dielectric layer, the retained second metal layer is the scan line and serves as an upper electrode as well and the side edge of the lower electrode is exposed; the pixel electrode formed in the step of pattering the transparent conductive layer is electrically connected to the lower electrode via the side edge of the lower electrode.

In an embodiment of the present invention, the step of patterning the first metal layer and the semiconductor layer further includes forming a lower electrode located at a position preserved to form the pixel electrode; and the step of patterning the protection layer, the second metal layer and the gate dielectric layer further includes retaining the gate dielectric layer, the second metal layer and the protection layer located all over the lower electrode, wherein the gate dielectric layer serves as a capacitance dielectric layer, the preserved second metal layer is a common line and serves as an upper electrode as well and the side edge of the lower electrode is exposed; and the pixel electrode formed in the above-mentioned step of patterning the transparent conductive layer is electrically connected to the lower electrode via the side edge of the lower electrode.

In an embodiment of the present invention, the semiconductor layer includes a channel material layer and an Ohm contact material layer located between the channel material layer and the first metal layer.

In an embodiment of the present invention, the step of pattering the first metal layer and the semiconductor layer includes following steps. First, a first halftone photomask is used to form a first patterned photoresist layer on the first metal layer. Then, the first patterned photoresist layer is used as an etching mask to define the source, the drain, the channel layer, the data line and the first pad; and removing the first metal layer between the source and the drain.

In an embodiment of the present invention, the step of patterning the protection layer, the second metal layer and the gate dielectric layer includes following steps. First, a second halftone photomask is used to form a second patterned photoresist layer on the protection layer. Then the second patterned photoresist layer is used as an etching mask to define the gate, the scan line and the second pad; and removing the protection layer over the first pad and the second pad.

In an embodiment of the present invention, the step of patterning the protection layer, the second metal layer and the gate dielectric layer further includes over-etching the second metal layer so as to make the widths of the formed gate and scan line smaller than the width of the patterned protection layer.

In an embodiment of the present invention, the step of patterning the transparent conductive layer further includes retaining the transparent conductive layer located over the first pad and the second pad.

In an embodiment of the present invention, the step of forming a light-shielding layer on the substrate includes following steps. First, a black matrix is formed on the substrate. Next, a plurality of color filter patterns is formed in regions defined by the black matrix, wherein the color filter patterns include a plurality of red filter patterns, a plurality of green filter patterns and a plurality of blue filter patterns.

Based on the above description, the present invention also provides a pixel structure including a light-shielding layer, a flat layer, a TFT, a protection layer, a pixel electrode and a storage capacitor. The light-shielding layer is disposed on a substrate. The flat layer covers the light-shielding layer. The TFT is disposed on the flat layer and includes a channel layer, a source and a drain together covering a part of the channel layer, a gate dielectric layer disposed on the source and the drain, and a gate disposed on the gate dielectric layer. The protection layer covers the TFT and exposes a part of the source and the drain. The pixel electrode is disposed on the flat layer, covers the source and the drain and is electrically connecting to the exposed part of the drain. The storage capacitor is disposed on the flat layer and includes the lower electrode, the upper electrode and the capacitance dielectric layer, wherein the lower electrode is located at a position preserved to form the scan line; the side edge of the lower electrode is exposed; the upper electrode is the scan line; the capacitance dielectric layer is located between the lower electrode and the scan line; and the pixel electrode is electrically connected to the lower electrode via the side edge of the lower electrode.

In an embodiment of the present invention, the pixel structure further includes an Ohm contact material layer disposed between the source/drain and the channel layer.

In an embodiment of the present invention, the widths of the gate and scan line are smaller than the width of the protection layer.

In an embodiment of the present invention, the pixel structure further includes a first pad and a second pad respectively disposed at an edge of the substrate.

In an embodiment of the present invention, the pixel structure further includes a transparent conductive layer located over the first pad and the second pad.

In an embodiment of the present invention, the light-shielding layer includes a black matrix and a plurality of color filter patterns disposed in regions defined by the black matrix, wherein the color filter patterns include a plurality of red filter patterns, a plurality of green filter patterns and a plurality of blue filter patterns.

Based on the above description, the present invention further provides a pixel structure including a light-shielding layer, a flat layer, a TFT, a protection layer, a pixel electrode and a storage capacitor. The light-shielding layer is disposed on a substrate. The flat layer covers the light-shielding layer. The TFT is disposed on the flat layer and includes a channel layer, a source and a drain together covering a part of the channel layer, a gate dielectric layer disposed on the source and the drain, and a gate disposed on the gate dielectric layer. The protection layer covers the TFT and exposes a part of the source and the drain. The pixel electrode is disposed on the flat layer, covers the source and the drain and is electrically connected to the exposed part of the drain. The storage capacitor is disposed on the flat layer and includes the lower electrode, the upper electrode and the capacitance dielectric layer, wherein the lower electrode is located at a position preserved to form the pixel electrode; the side edge of the lower electrode is exposed; the upper electrode is a common line; the capacitance dielectric layer is located between the lower electrode and the common line; and the pixel electrode is electrically connected to the lower electrode via the side edge of the lower electrode.

In an embodiment of the present invention, the pixel structure further includes an Ohm contact material layer disposed between the source/drain and the channel layer.

In an embodiment of the present invention, the widths of the gate and common line are smaller than the width of the protection layer.

In an embodiment of the present invention, the pixel structure further includes a first pad and a second pad respectively disposed at a side edge of the substrate.

In an embodiment of the present invention, the pixel structure further includes a transparent conductive layer located over the first pad and the second pad.

In an embodiment of the present invention, the light-shielding layer includes a black matrix and a plurality of color filter patterns disposed in regions defined by the black matrix, wherein the color filter patterns include a plurality of red filter patterns, a plurality of green filter patterns and a plurality of blue filter patterns.

The method for fabricating a pixel structure provided by the present invention utilizes three halftone photomasks so as to complete the fabrication of the pixel structure, and therefore the number of photomasks compared to the aforementioned prior art is substantially reduced and thereby reduce the fabrication cost. In addition, the pixel structure and the storage capacitor are simultaneously formed, which is helpful to promote the display efficiency of the pixel structure. Further, the pixel electrode is electrically connected to the lower electrode via the side edge of the lower electrode of the storage capacitor. Therefore, an electrical charging can be conducted on the pixel electrode and the storage capacitor simultaneously. The gate and the scan line are cut out for a partial width by over-etching to be inward from the patterned protection layer over the gate and the scan line by a distance. So, the resulted structure can avoid the pixel structure from being disabled and promote the yield of the pixel structure due to the formed pixel electrode is unable to electrically contact the gate and the scan line.

Furthermore, the pixel structure is an 'array on color filter substrate (AOC)' structure, which is able to avoid producing leakage current generated by irradiating the channel layer.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
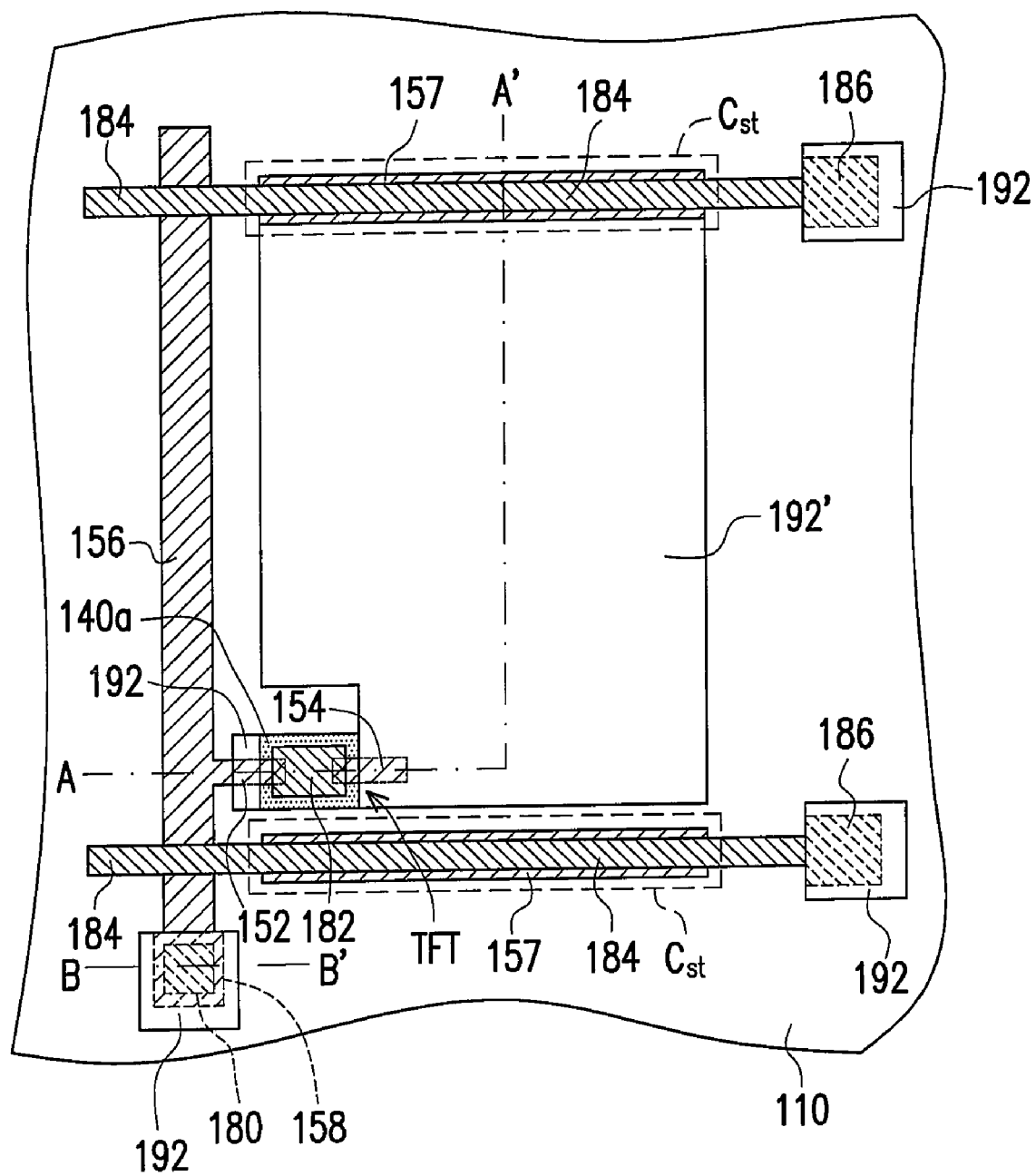
FIG. 1 is a top view diagram of a pixel structure according to a first embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

The First Embodiment

FIG. 1 is a top view diagram of a pixel structure according to a first embodiment of the present invention. FIGS. 2A-2F are diagrams showing the steps of a method of fabricating the pixel structure according to the first embodiment of the present invention. Referring to FIGS. 1 and 2A-2F, the A-A' region and the B-B' region in FIGS. 2A-2F are respectively a cross-section along the A-A' line and the B-B' line.

Figure 2A:
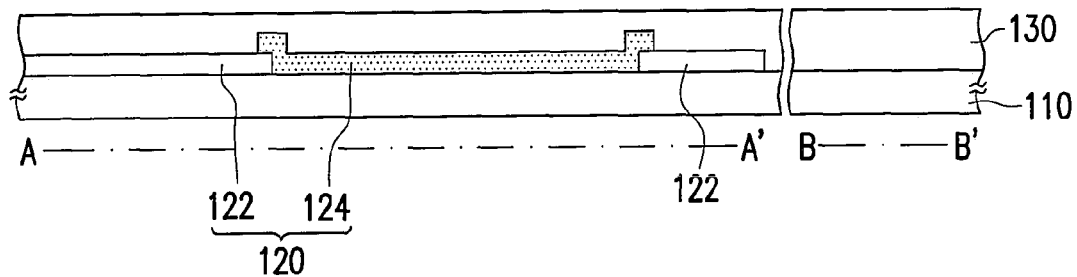
FIGS. 2A-2F are diagrams showing the steps of a method for fabricating the pixel structure according to the first embodiment of the present invention.

Referring to FIGS. 1 and 2A, a substrate 110, including a light-shielding layer 120 and a flat layer 130 covering the light-shielding layer 120 formed thereon, is provided. The light-shielding layer 120 may be formed on the substrate 110 by the following process. First, a black matrix 122 is formed on the substrate 110 by, for example, a printing process or ink-jetting process. Next, a plurality of color filter patterns 124 is formed in regions defined by the black matrix 122 with an ink-jetting process. The color filter patterns 124 include a plurality of red filter patterns, a plurality of green filter patterns and a plurality of blue filter patterns (in FIG. 2A only one color filter pattern is shown). The method of forming the flat layer 130 includes low-temperature chemical deposition process or spin coating process, and the material of the flat layer 130 includes silicon oxide or transparent resin. The present invention does not limit the material and the method of forming the flat layer 130.

Figure 2B:
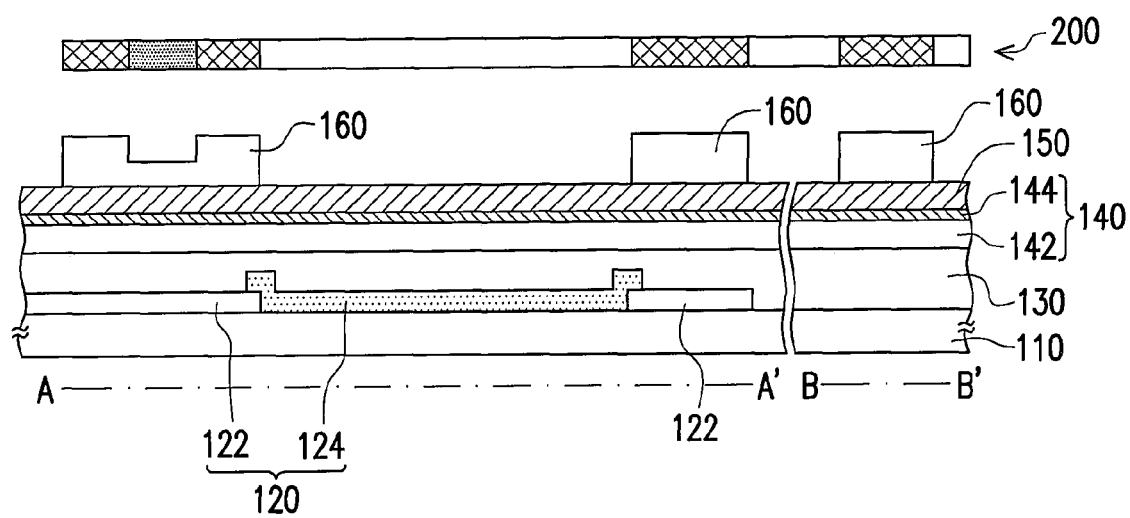

Next, referring to FIG. 2B, a semiconductor layer 140 and a first metal layer 150 are sequentially formed on the flat layer 130. The method of forming the semiconductor layer 140 includes chemical deposition process; and the method of forming the first metal layer 150 includes sputtering process. In an embodiment, the semiconductor layer 140 may include a channel material layer 142 and an Ohm contact material layer 144 located between the channel material layer 142 and the first metal layer 150. The material of the channel material layer 142 may includes amorphous silicon (a-Si) or polysilicon, and the material of the Ohm contact material layer 144 includes doped a-Si. Certainly in other embodiments, the Ohm contact material layer 144 may be optionally omitted.

Figure 2C:
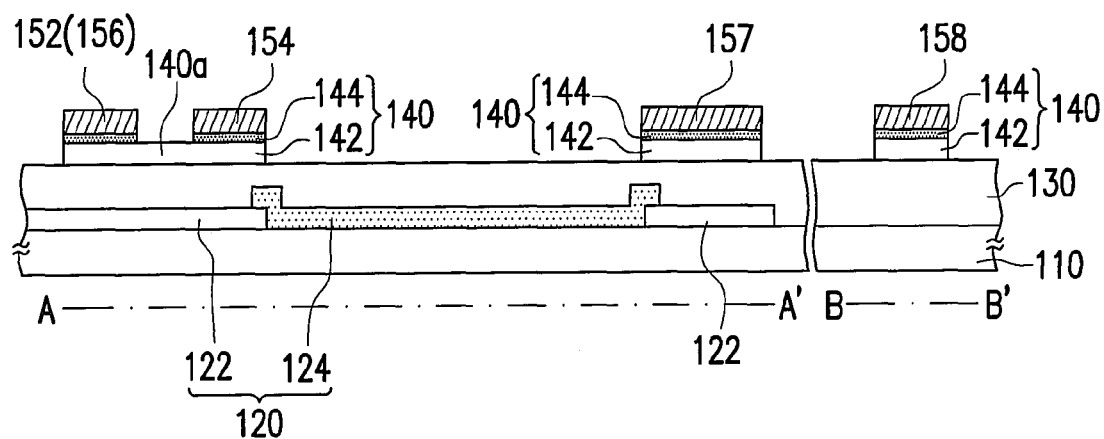

Referring to FIGS. 1, 2B and 2C, a first photomask process is conducted to pattern the first metal layer 150 and the semiconductor layer 140, so as to form a source 152, a drain 154, a channel layer 140a, a data line 156 and a first pad 158, wherein the channel layer 140a is connected to the source 152 and the drain 154, and the data line 156 is connected to the source 152 and the first pad 158. Each of the photomask processes herein uses a corresponding photomask pattern to perform a lithography process and a successive etching process.

As shown in FIG. 2B, a first halftone photomask 200 may be used in the first photomask process to form a first patterned photoresist layer 160 on the first metal layer 150. Then, the first patterned photoresist layer 160 is used as an etching mask to define the source 152, the drain 154, the channel layer 140a, the data line 156 and the first pad 158 and to remove the first metal layer 150 between the source 152 and the drain 154 simultaneously. In addition, with the case where the Ohm contact material layer 144 is formed, the Ohm contact material layer 144 is also patterned. The first photomask process further includes defining a lower electrode 157 located at the position preserved for the scan line 184 to be formed (referring to FIGS. 1 and 2E). After etching, the first patterned photoresist layer 160 is removed.

Figure 2D:
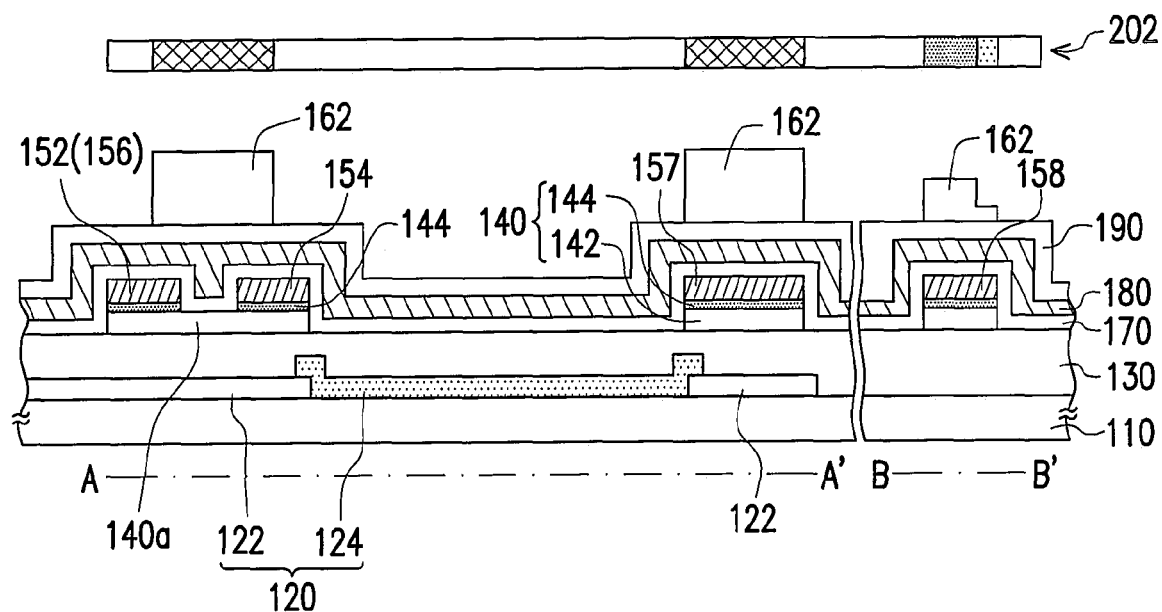

Referring to FIGS. 1 and 2D, a gate dielectric layer 170, a second metal layer 180 and a protection layer 190 are sequentially formed on the substrate 110 by performing, for example, a chemical deposition process, and the second metal layer 180 may be formed by a sputtering process.

Figure 2E:
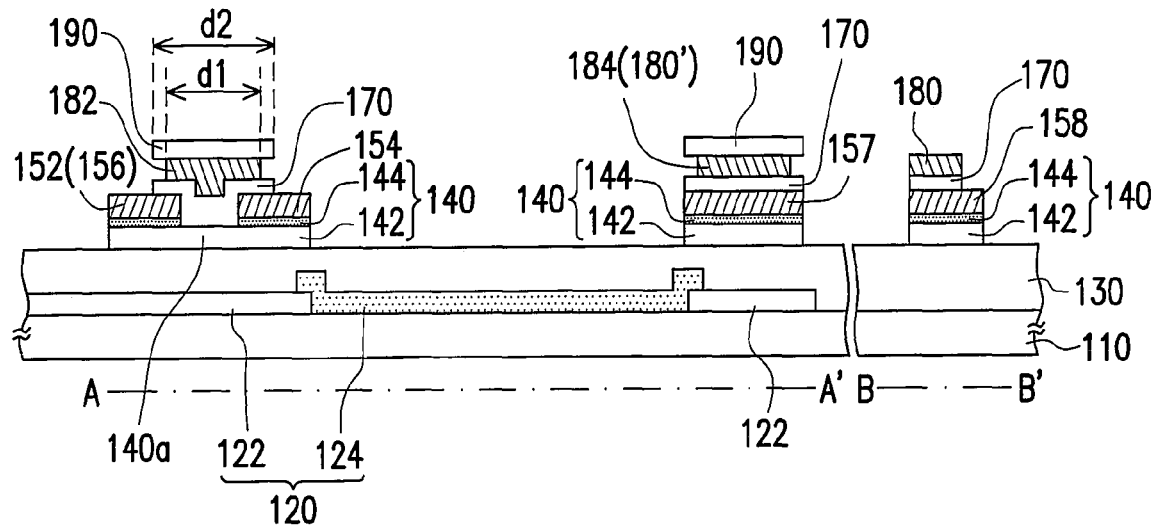

Referring to FIGS. 1, 2D and 2E, a second photomask process is conducted to pattern the protection layer 190, the second metal layer 180 and the gate dielectric layer 170 so as to define a gate 182, a scan line 184 and a second pad 186 and to expose a part of the drain 154, wherein the gate 182 and the channel layer 140a are stacked on each other and the scan line 184 is connected to the gate 182 and the second pad 186.

A second halftone photomask 202 may be used in the second photomask process to form a second patterned photoresist layer 162 on the protection layer 190. Then, the second patterned photoresist layer 162 is used as an etching mask to define the gate 182, the scan line 184 and the second pad 186, and the protection layer 190 located over the first pad 158 and the second pad 186 is removed simultaneously. Note that, the second photomask process may further include conducting an over-etching process (for example, a wet etching process) on the second metal layer 180, so that the widths d1 of the gate 182 and scan line 184 is smaller than the width d2 of the patterned protection layer 190.

The second photomask process may further include retaining the gate dielectric layer 170, second metal layer 180 and protection layer 190 all located over the lower electrode 157, wherein the gate dielectric layer 170 serves as a capacitance dielectric layer, the retained second metal layer 180 is the scan line 184 and serves as an upper electrode 180' and the side edge of the lower electrode 157 is exposed.

Figure 2F:
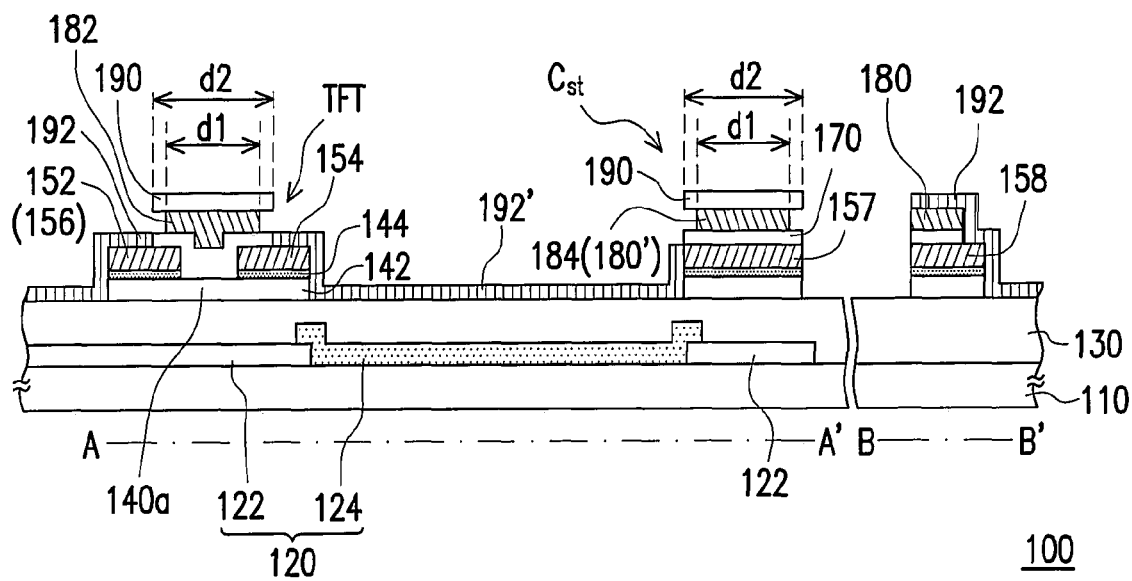

Referring to FIGS. 1 and 2F, a transparent conductive layer 192 is formed on the substrate 110, and a third photomask process is conducted to pattern the transparent conductive layer 192 to form a pixel electrode 192', wherein the pixel electrode 192' is electrically connected to the exposed drain 154. As shown in FIGS. 1 and 2F, the third photomask process may further include retaining the transparent conductive layer 192 located over the first pad 158 and the second pad 186. In particular, the pixel electrode 192' formed by the third photomask process is electrically connected to the lower electrode 157 via the side edge of the lower electrode 157.

According to the above description, the method of fabricating the pixel structure of the present invention employs halftone photomasks to complete the fabrication of the pixel structure 100 by using only three photomasks, which substantially reduces the number of photomasks and thereby significantly reduce the fabrication cost. In addition, the lower electrode 157 formed by the first photomask process, the gate dielectric layer 170 formed by the second photomask process, the second metal layer 180 serves as the upper electrode 180' and the protection layer 190 together form a storage capacitor Cst of the pixel structure 100, wherein the storage capacitor Cst is disposed at a location preserved to form the scan line 184 (as shown in FIG. 1 and FIG. 2F). Further, the pixel electrode 192' is electrically connected to the drain 154 and the lower electrode 157 via the side edge of the lower electrode 157. Therefore, an electrical charging can be simultaneously conducted on the pixel electrode 192' and the storage capacitor Cst (i.e. the lower electrode 157, the gate dielectric layer 170 and the upper electrode 180' as shown by FIG. 2F).

By using the above fabricating method described in FIGS. 2A-2F, the pixel structure 100 can be obtained. The pixel structure 100 includes a light-shielding layer 120, a flat layer 130, a thin film transistor TFT, a protection layer 190, a pixel electrode 192' and a storage capacitor Cst. The light-shielding layer 120 is disposed on the substrate 110. The flat layer 130 covers the light-shielding layer 120. The thin film transistor TFT is disposed on the flat layer 130 and includes the channel layer 140a, the source 152 and the drain 154 together covering a part of the channel layer 140a, the gate dielectric layer 170 disposed on the source 152 and the drain 154, and the gate 182 disposed on the gate dielectric layer 170. The protection layer 190 covers the thin film transistor TFT and exposes a part of the source 152 and the drain 154. The pixel electrode 192' is disposed on the flat layer 130, covers the source 152 and the drain 154 and is electrically connected to the exposed part of the drain 154. The storage capacitor Cst is disposed on the flat layer 130 and includes the lower electrode 157, the upper electrode 180' and the capacitance dielectric layer 170, wherein the lower electrode 157 is located at a position preserved to form the scan line 184, and the side edge of the lower electrode 157 is exposed; the upper electrode 180' is the scan line 184; the capacitance dielectric layer 170 is located between the lower electrode 157 and the scan line 184; and the pixel electrode 192' is electrically connected to the lower electrode 157 via the side edge of the lower electrode 157.

Continuing refer to FIGS. 1 and 2F, the pixel structure 100 may further include an Ohm contact material layer 144 disposed between the source 152/drain 154 and the channel layer 140a, which is able to reduce the electrical impedance between the channel layer 140a and the source 152 and drain 154.

As shown in FIG. 2F, the widths d1 of the gate 182 and the scan line 184 are smaller than the width d2 of the patterned protection layer 190, i.e., the gate 182 and the scan line 184 are cut out for a partial width by over-etching to be inward from the patterned protection layer 190 thereover by a distance. So, the formed pixel electrode 192' is unable to electrically contact the gate 182 and the scan line 184, which can avoid the pixel structure 100 from being disabled and thereby promote the production yield of the pixel structure 100.

Referring to FIG. 1, the pixel structure 100 may further includes a first pad 158 and a second pad 186 respectively disposed at a side edge of the substrate 110. In particular, the transparent conductive layer 192 is located over the first pad 158 and the second pad 186, which benefits the electrical connections of other circuit devices.

Besides, the slight-shielding layer 120 may include a black matrix 122 and a plurality of color filter patterns 124 disposed in regions defined by the black matrix 122, wherein the color filter patterns 124 include a plurality of red filter patterns, a plurality of green filter patterns and a plurality of blue filter patterns. In this way, the light-shielding layer 120 can prevent any light from irradiating the channel layer 140a, and contributes to reduce the leakage current generated by the light irradiation. Furthermore, the pixel structure 100 is an 'array on color filter substrate (AOC)' structure, which is able to effectively simplify the pixel structure 100.

The Second Embodiment

Figure 3:
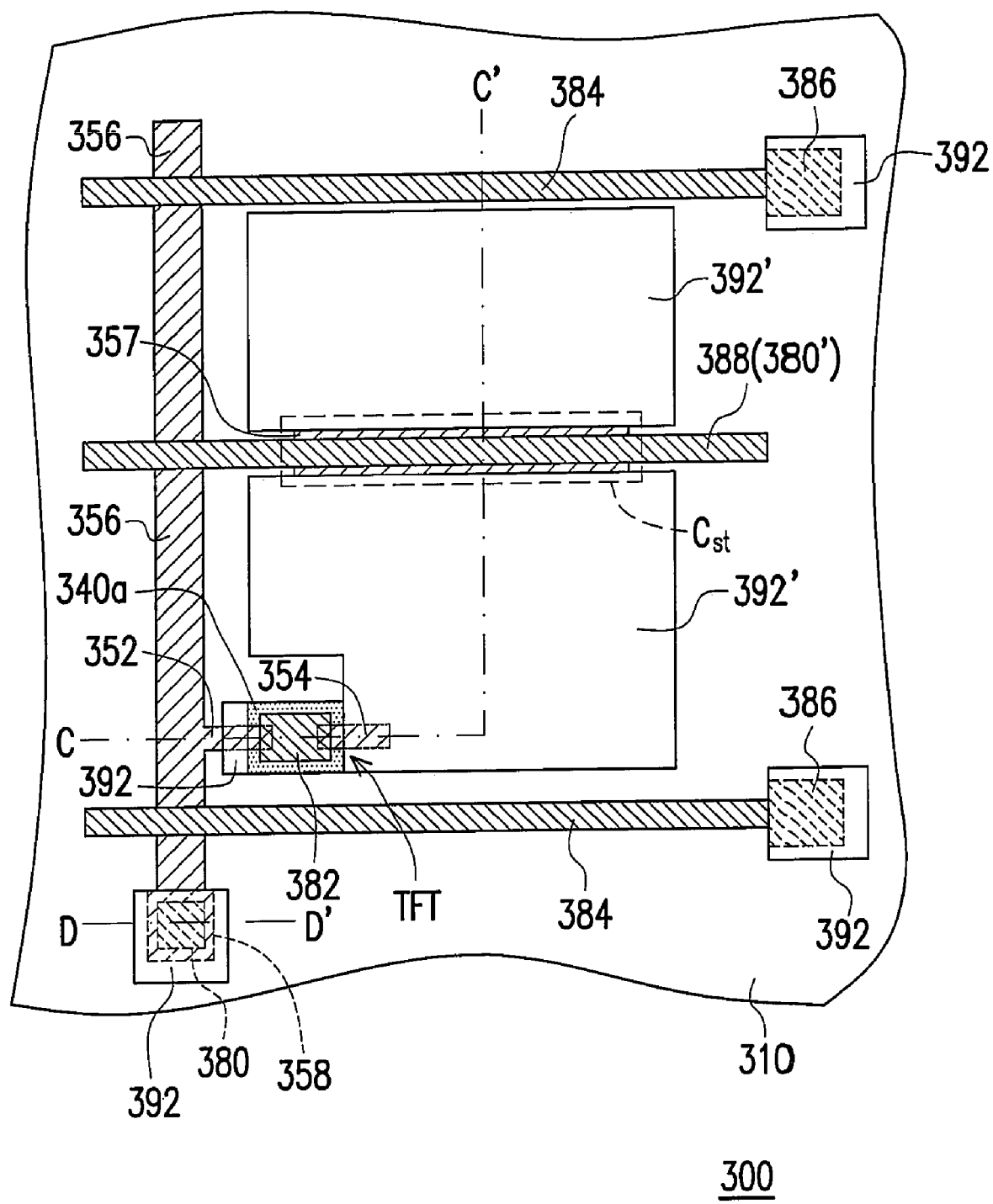
FIG. 3 is a top view diagram of a pixel structure according to a second embodiment of the present invention.

FIG. 3 is a top view diagram of a pixel structure according to a second embodiment of the present invention. FIGS. 4A-4F are schematic diagrams showing the steps of a method of fabricating the pixel structure according the second embodiment of the present invention. Referring to FIGS. 3 and 4A-4F, the C-C' region and the D-D' region in FIGS. 4A-4F are respectively a cross-section along the C-C' line and the D-D' line.

Figure 4A:
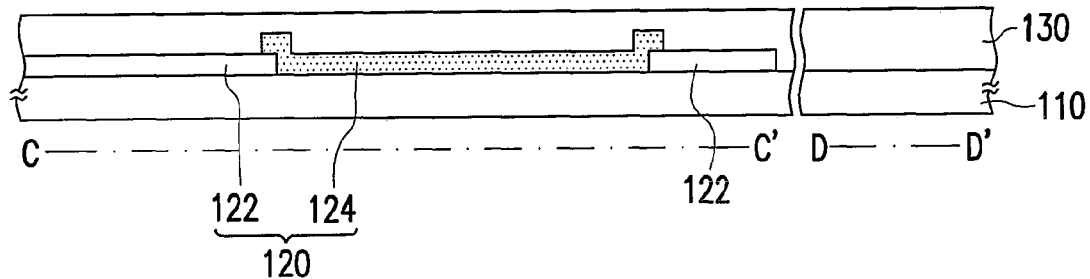
FIGS. 4A-4F are diagrams showing the steps of a method for fabricating the pixel structure according to a second embodiment of the present invention.

Referring to FIGS. 3 and 4A, a substrate 310, including a light-shielding layer 320 and a flat layer 330 covering the light-shielding layer 320 formed thereon, is provided. The light-shielding layer 320 may be formed on the substrate 310 by the following process. First, a black matrix 322 is formed on the substrate 310 by, for example, a printing process or an ink-jetting process. Next, a plurality of color filter patterns 324 is formed in regions defined by the black matrix 122 with an ink-jetting process. The color filter patterns 324 include a plurality of red filter patterns, a plurality of green filter patterns and a plurality of blue filter patterns (in FIG. 4A only one color filter pattern is shown). The process of forming the flat layer 330 includes a low-temperature chemical deposition process or a spin coating process, and the material of the flat layer 330 includes silicon oxide or transparent resin. The present invention does not limit the material and the method of forming the flat layer 330.

Figure 4B:
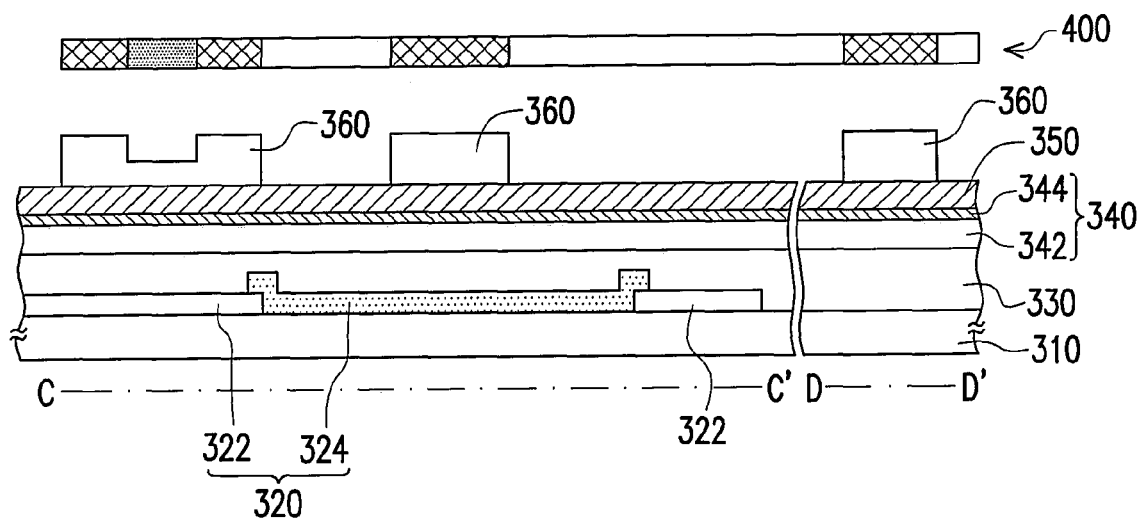

Next, referring to FIG. 4B, a semiconductor layer 340 and a first metal layer 350 are sequentially formed on the flat layer 330. The method of forming the semiconductor layer 340 includes chemical deposition process. The method of forming the first metal layer 350 includes sputtering process. In an embodiment of the present invention, the semiconductor layer 340 may include a channel material layer 342 and an Ohm contact material layer 344 located between the channel material layer 342 and the first metal layer 350. The material of the channel material layer 342 may includes amorphous silicon (a-Si) or polysilicon, and the material of the Ohm contact material layer 344 may includes doped a-Si. Certainly in other embodiments, the Ohm contact material layer 344 may be optionally omitted.

Figure 4C:
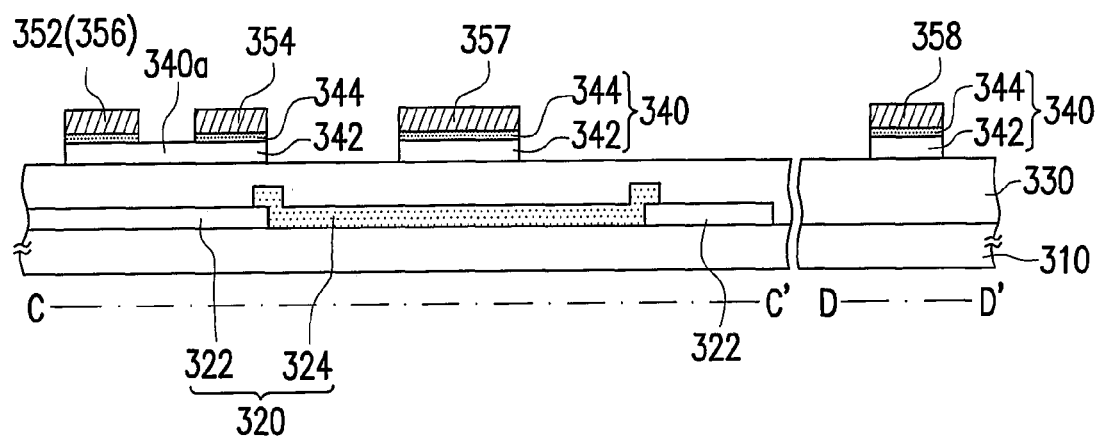

Referring to FIGS. 3, 4B and 4C, a first photomask process is conducted to pattern the first metal layer 350 and the semiconductor layer 340, so as to form a source 352, a drain 354, a channel layer 340a, a data line 356 and a first pad 358, wherein the channel layer 340a is connected to the source 352 and the drain 354, and the data line 356 is connected to the source 352 and the first pad 358. A first halftone photomask 400 may be used in the first photomask process to form a first patterned photoresist layer 360 on the first metal layer 350. Then, the first patterned photoresist layer 360 is used as an etching mask to define the source 352, a drain 354, a channel layer 340a, the data line 356 and a first pad 358 and to remove the first metal layer 350 between the source 352 and the drain 354 simultaneously. In addition, in a case where the Ohm contact material layer 344 is formed, the Ohm contact material layer 344 is also patterned. The first photomask process further includes defining a lower electrode 357 located at the position preserved for the pixel electrode 392 to be formed (referring to FIG. 4F). After etching, the first patterned photoresist layer 360 is removed.

Figure 4D:
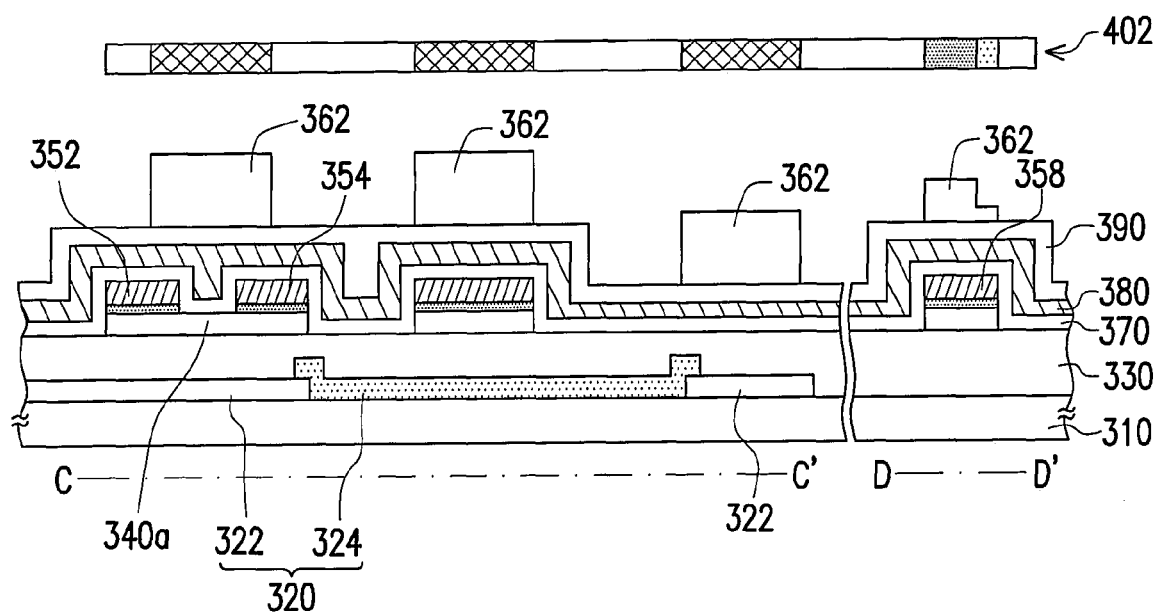

Referring to FIGS. 3 and 4D, a gate dielectric layer 370, a second metal layer 380 and a protection layer 390 are sequentially formed on the substrate 310. Similarly, the method of forming the gate dielectric layer 370 and the protection layer 390 may includes chemical deposition process, and the method of forming the second metal layer 380 may includes sputtering process.

Figure 4E:
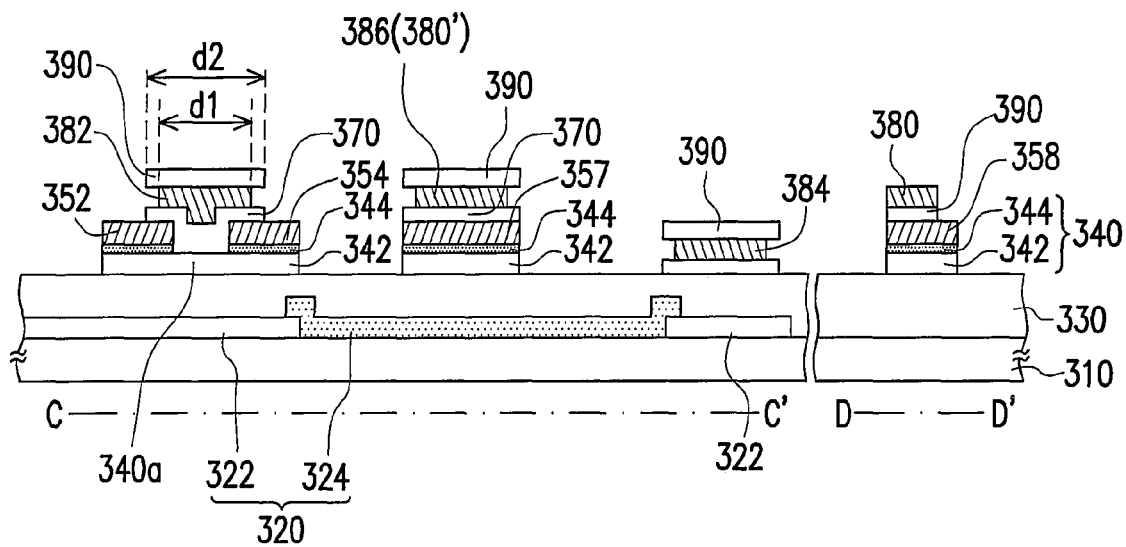

Referring to FIGS. 3, 4D and 4E, a second photomask process is conducted to pattern the protection layer 390, the second metal layer 380 and the gate dielectric layer 370 so as to form a gate 382, a scan line 384 and a second pad 386 and to expose a part of the drain 354, wherein the gate 382 and the channel layer 340a are stacked on each other and the scan line 382 is connected to the gate 382 and the second pad 386.

A second halftone photomask 402 may be used in the second photomask process to form a second patterned photoresist layer 362 on the protection layer 390. Then, the second patterned photoresist layer 362 is used as an etching mask to define the gate 382, the scan line 384 and the second pad 386, and the protection layer 390 located over the first pad 358 and the second pad 386 is removed simultaneously. Note that, the second photomask process may further include conducting an over-etching process (for example, a wet etching process) on the second metal layer 380, so that the widths d1 of the formed gate 382 and scan line 384 is smaller than the width d2 of the patterned protection layer 390.

The second photomask process may further includes retaining the gate dielectric layer 370, second metal layer 380 and protection layer 390 all located over the lower electrode 357, wherein the gate dielectric layer 370 serves as a capacitance dielectric layer, the retained second metal layer 380 is a common line 388 and serves as an upper electrode 380' and the side edge of the lower electrode 357 is exposed.

Figure 4F:
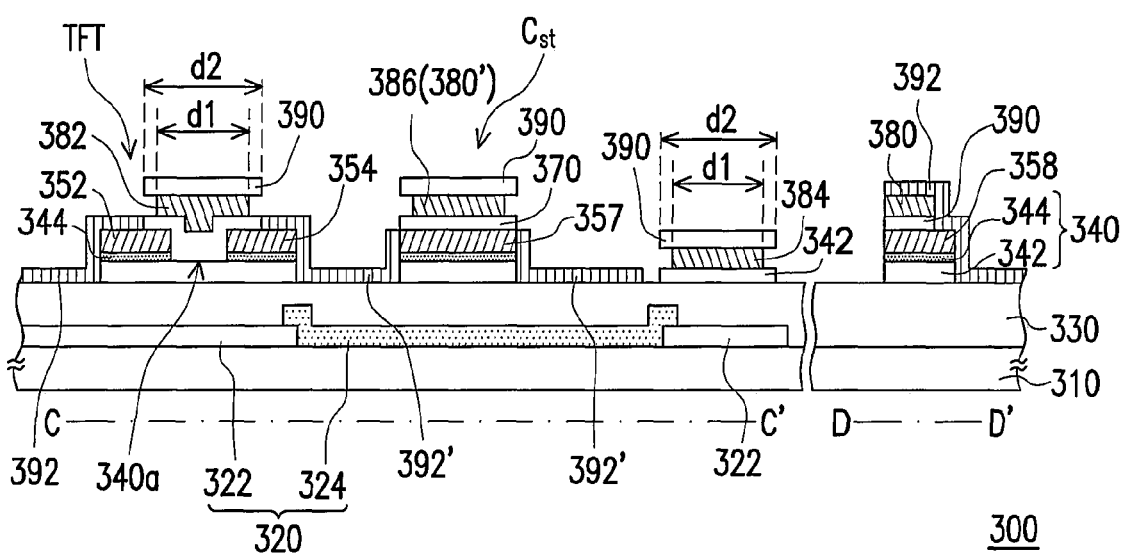

Moreover referring to FIGS. 3 and 4F, a transparent conductive layer 392 is formed on the substrate 310, and a third photomask process is conducted to pattern the transparent conductive layer 392 to form a pixel electrode 392', wherein the pixel electrode 392' is electrically connected to the exposed drain 354. As shown in FIG. 3, the third photomask process may further include retaining the transparent conductive layer 392 located over the first pad 358 and the second pad 386. In particular, the pixel electrode 392' formed by the third photomask process is electrically connected to the lower electrode 357 via the side edge of the lower electrode 357.

According to the above description, the method of fabricating the pixel structure of the present invention employs halftone photomasks to complete the fabrication of the pixel structure 300 by using only three photomasks. Thus the number of photomasks compared to the aforementioned prior art is reduced and the fabrication cost is therefore reduced. In addition, the lower electrode 357 formed by the first photomask process, the gate dielectric layer 370 formed by the second photomask process, the second metal layer 380 serves as the upper electrode 380' and the protection layer 390 together form a storage capacitor Cst of the pixel structure 300, wherein the storage capacitor Cst is disposed at a location preserved to form the common line 384 (as shown in FIG. 3 and FIG. 4F). Further, the pixel electrode 392' is electrically connected to the drain 354 and the lower electrode 357 via the side edge of the lower electrode 357. Therefore, an electrical charging can be simultaneously conducted on the pixel electrode 392' and the storage capacitor Cst (i.e. the lower electrode 357, the gate dielectric layer 370 and the upper electrode 380' as shown by FIG. 4F).

By utilizing the above fabricating method described in FIG. 4A~4F, the pixel structure 300 may be obtained. The pixel structure 300 includes a light-shielding layer 320, a flat layer 330, a thin film transistor TFT, a protection layer 390, a pixel electrode 392' and a storage capacitor Cst. The light-shielding layer 320 is disposed on the substrate 310. The flat layer 330 covers the light-shielding layer 320. The thin film transistor TFT is disposed on the flat layer 330 and includes the channel layer 340a, the source 352 and the drain 354 together covering a part of the channel layer 340a, the gate dielectric layer 370 disposed on the source 352 and the drain 354, and the gate 382 disposed on the gate dielectric layer 370. The protection layer 390 covers the thin film transistor TFT and exposes a part of the source 352 and the drain 354. The pixel electrode 392' is disposed on the flat layer 330, covers the source 352 and the drain 354 and is electrically connected to the exposed part of the drain 354. The storage capacitor Cst is disposed on the flat layer 330 and includes the lower electrode 357, the upper electrode 380' and the capacitance dielectric layer 370, wherein the lower electrode 357 is located at a position preserved to form the pixel electrode 392', and the side edge of the lower electrode 357 is exposed; the upper electrode 380' is a common line 388; the capacitance dielectric layer 370 is located between the lower electrode 357 and the scan line 384; and the pixel electrode 392' is electrically connected to the lower electrode 357 via the side edge of the lower electrode 357.

Continuing refer to FIGS. 3 and 4F, the pixel structure 300 may further include an Ohm contact material layer 344 disposed between the source 352/drain 354 and the channel layer 340a, which is able to reduce the electrical impedance between the channel layer 340a and the source 352 and drain 354.

As shown in FIG. 4F, the widths d1 of the gate 382 and the scan line 384 are smaller than the width d2 of the patterned protection layer 390, i.e. the gate 382 and the scan line 384 are cut out for a partial width by over-etching to be inward from the patterned protection layer 390 over the gate 382 and the scan line 384 by a distance. So, the formed pixel electrode 392' is unable to electrically contact the gate 382 and the scan line 384, which can avoid the pixel structure 300 from being disabled and promote the production yield of the pixel structure 300.

Referring to FIG. 3, the pixel structure 300 may further includes a first pad 358 and a second pad 386 respectively disposed at a side edge of the substrate 310. In particular, the transparent conductive layer 392 is located over the first pad 358 and the second pad 386, which benefits the electrical connections of other circuit devices.

Besides, the slight-shielding layer 320 may include a black matrix 322 and a plurality of color filter patterns 324 disposed in regions defined by the black matrix 322, wherein the color filter patterns 324 include a plurality of red filter patterns, a plurality of green filter patterns and a plurality of blue filter patterns. In this way, the light-shielding layer 320 can prevent any light from irradiating the channel layer 340a, and contributes to reduce the leakage current generated by the light irradiation. Furthermore, the pixel structure 300 can be an 'array on color filter substrate (AOC)' structure, which is able to effectively simplify the pixel structure 300.

In summary, a pixel structure and the method thereof provided by the present invention has at least following advantages.

The method utilizes only three photomasks to complete the fabrication of the pixel structure, therefore the number of the photomasks is substantially reduced and the fabrication cost is significantly reduced. The pixel structure and the storage capacitor are simultaneously formed to promote the display efficiency of the pixel structure.

The pixel electrode is electrically connected to the lower electrode via the side edge of the lower electrode, so that an electrical charging on both the pixel electrode and the storage capacitor can be simultaneously conducted. The gate and scan line are inward from the protection layer located over the gate and scan line by a distance with an over-etching process, so that the pixel electrode is unable to electrically contact the gate and scan line, and thereby avoid being disabled and accordingly promote the production yield thereof. The pixel structure includes an 'array on color filter substrate (AOC)', which is able to effectively simplify the pixel structure and avoid the channel layer from any light irradiation to produce a leakage current.

The above described are preferred embodiments of the present invention only, which do not limit the implementation scope of the present invention. It will be apparent to those skilled in the art that various modifications and equivalent variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method for fabricating a pixel structure, comprising:
providing a substrate, comprising a light-shielding layer and a flat layer covering on the light-shielding layer thereon;
sequentially forming a semiconductor layer and a first metal layer on the flat layer;
patterning the first metal layer and the semiconductor layer utilizing a first halftone photomask to form a source, a drain, a channel layer, a data line and a first pad, wherein the channel layer is located above the light-shielding layer and connected to the source and the drain, and the data line is connected the source and the first pad;
sequentially forming a gate dielectric layer, a second metal layer and a protection layer;
patterning the protection layer, the second metal layer and the gate dielectric layer utilizing a second halftone photomask to form a gate, a scan line, and a second pad, expose a part of the drain, and remove portions of the protection layer located over the first pad and the second pad simultaneously, the gate being located above the channel layer, wherein the gate and the channel layer are stacked on each other, and the scan line is connected the gate and the second pad;
forming a transparent conductive layer on the substrate; and
patterning the transparent conductive layer to form a pixel electrode and retain portions of the transparent conductive layer located over the first pad and the second pad, respectively, wherein the pixel electrode is electrically connected to the exposed drain.

2. The method for fabricating a pixel structure as recited in claim 1, further comprises:
defining a lower electrode located at a position preserved to form the scan line when patterning the first metal layer and the semiconductor layer;
retaining the gate dielectric layer, the second metal layer and the protection layer all located over the lower electrode when patterning the protection layer, the second metal layer and the gate dielectric layer, wherein the gate dielectric layer serves as a capacitance dielectric layer, the retained second metal layer is the scan line and serves as an upper electrode, and the side edge of the lower electrode is exposed; and
electrically connecting the transparent conductive layer to the lower electrode via the side edge of the lower electrode when patterning the transparent conductive layer to form the pixel electrode.

3. The method for fabricating a pixel structure as recited in claim 1, further comprises:
defining a lower electrode located at a position preserved to form the pixel electrode when patterning the first metal layer and the semiconductor layer;
retaining the gate dielectric layer, the second metal layer and the protection layer all located over the lower electrode when patterning the protection layer, the second metal layer and the gate dielectric layer, wherein the gate dielectric layer serves as a capacitance dielectric layer, the retained second metal layer is a common line and serves as an upper electrode, and the side edge of the lower electrode is exposed; and
electrically connecting the transparent conductive layer to the lower electrode via the side edge of the lower electrode when patterning the transparent conductive layer to form the pixel electrode.

4. The method for fabricating a pixel structure as recited in claim 1, wherein the semiconductor layer comprises a channel material layer and an Ohm contact material layer located between the channel material layer and the first metal layer.

5. The method for fabricating a pixel structure as recited in claim 1, wherein patterning the first metal layer and the semiconductor layer comprises:
utilizing the first halftone photomask to form a first patterned photoresist layer on the first metal layer; and
using the first patterned photoresist layer as an etching mask to simultaneously form the source, the drain, the channel layer, the data line and the first pad and remove the first metal layer between the source and the drain.

6. The method for fabricating a pixel structure as recited in claim 1, wherein patterning the protection layer, the second metal layer and the gate dielectric layer comprises:
utilizing the second halftone photomask to form a second patterned photoresist layer on the protection layer; and
using the second patterned photoresist layer as an etching mask to simultaneously form the gate, the scan line and the second pad and remove the protection layer located over the first pad and the second pad.

7. The method for fabricating a pixel structure as recited in claim 1, further comprises conducting an over-etching on the second metal layer so as to make the widths of the formed gate and scan line smaller than the width of the patterned protection layer when patterning the protection layer, the second metal layer and the gate dielectric layer.

8. The method for fabricating a pixel structure as recited in claim 1, wherein the method of forming the light-shielding layer on the substrate comprises:
forming a black matrix on the substrate; and
forming a plurality of color filter patterns in regions defined by the black matrix.

9. The method for fabricating a pixel structure as recited in claim 8, wherein the color filter patterns comprise a plurality of red filter patterns, a plurality of green filter patterns and a plurality of blue filter patterns.

* * * * *